United States Patent [19]

Kuriyama

[11] Patent Number: 5,058,610
[45] Date of Patent: Oct. 22, 1991

[54] FLUID SUPPLYING AND PROCESSING DEVICE

[75] Inventor: Kazumi Kuriyama, Yamanashi, Japan

[73] Assignees: Pioneer Electronic Corporation, Tokyo; Pioneer Video Corporation, Yamanashi, both of Japan

[21] Appl. No.: 662,330

[22] Filed: Feb. 25, 1991

Related U.S. Application Data

[63] Continuation of Ser. No. 379,603, Jul. 14, 1989.

[30] Foreign Application Priority Data

Dec. 15, 1988 [JP] Japan ............................ 63-317710

[51] Int. Cl.⁵ .............................................. B08B 3/02
[52] U.S. Cl. .................................. 134/98; 134/104.1; 134/169 C; 134/170; 134/99; 239/112
[58] Field of Search ............... 239/112; 134/104.1, 134/198, 166 C, 169 C, 170

[56] References Cited

U.S. PATENT DOCUMENTS

| | | | |
|---|---|---|---|
| 2,384,921 | 9/1945 | Hugney | 239/558 X |
| 2,984,419 | 5/1961 | McOuat | 239/416.5 X |
| 3,146,950 | 9/1964 | Lancaster | 239/112 |
| 3,171,599 | 3/1965 | Rotolico | 239/558 X |
| 3,179,341 | 4/1965 | Plos et al. | 239/112 |
| 3,368,760 | 2/1968 | Perry | 239/416.4 X |
| 3,468,487 | 9/1969 | Warren | 239/416.4 X |
| 3,950,184 | 4/1976 | Adams et al. | 134/96 X |
| 4,027,686 | 6/1977 | Shortes | 134/95 X |
| 4,036,434 | 7/1977 | Anderson et al. | 239/112 X |
| 4,113,182 | 9/1978 | Brago | 239/417.5 |
| 4,635,852 | 1/1987 | Muhlnickle, Jr. | 239/416.4 X |
| 4,791,946 | 12/1988 | Cavanaugh et al. | 134/102 |
| 4,796,813 | 1/1989 | Marshall | 239/558 X |
| 4,865,252 | 9/1989 | Rotolico et al. | 239/416.4 |

FOREIGN PATENT DOCUMENTS

| | | | |
|---|---|---|---|
| 53-29674 | 3/1978 | Japan | 134/157 |
| 62-128125 | 6/1987 | Japan | 134/158 |

*Primary Examiner*—Frankie L. Stinson
*Attorney, Agent, or Firm*—Fleit, Jacobson, Cohn, Price, Holman & Stern

[57] ABSTRACT

A fluid supplying and processing device has a plurality of fluid guide pipes having distal ends opening above a workpiece such as a disc base. The open ends of the fluid guide pipes discharge respective different processing fluids supplied from respective fluid sources toward the workpiece for thereby processing the workpiece, such as to form a photoresist pattern on the surface of the disc base. At least one of the fluid guide pipes has at least a distal end portion inserted in another of the fluid guide pipes. The outer side surface of the distal end portion of said one fluid guide pipe is cleaned by a fluid flowing through the other surrounding fluid guide pipe.

7 Claims, 3 Drawing Sheets

FLUID SUPPLYING AND PROCESSING DEVICE

This application is a continuation of application Ser. No. 07/379,603, filed July 14, 1989 now abandoned.

BACKGROUND OF THE INVENTION

1. Field of the Invention

The present invention relates to a device for supplying a fluid to a workpiece so as to process the workpiece.

2. Description of the Related Art

One known device for supplying a fluid to a disc carrying thereon a photo-resist layer in the process of manufacturing a disc master is a spinner used in the step of forming a photo-resist pattern on a disc base or in the step of removing a photo-resist layer from a disc base.

FIG. 1 of the accompanying drawings illustrates such a known fluid supplying and processing device.

The fluid supplying and processing device includes a turntable 2 for carrying and rotating a workpiece 1 such as a disc base, and a spinner bowl 3 enclosing a working region around the turntable 2. Three fluid guide pipes 4, 5, 6 are disposed above the spinner bowl 3 for guiding fluids, such as a developing solution, a fixing solution, and a cleaning solution, respectively, which are supplied from respective fluid sources (not shown), onto the workpiece 1. The fluid guide pipes 4, 5, 6 have distal ends extending into the spinner bowl 3 and opening above the turntable 2 for discharging the respective fluids toward the workpiece 1 on the turntable 2. The supply of the fluids through the fluid guide pipes 4, 5, 6 is controlled by automatically opening and closing cocks 7, 8, 9 which are disposed respectively in the pipes 4, 5, 6, respectively. The fluids are discharged from the fluid guide pipes 4, 5, 6 while the turntable 2 is being rotated. As the fluids are discharged from the fluid guide pipes 4, 5, these pipes 4, 5, are moved radially with respect to the turntable 2.

If the fluid discharged by the fluid guide pipe 4 is of a solidifiable nature, then some of the fluid discharged thereby remains on the open end of the pipe 4 and is deposited thereon as shown. The fluid discharged form the fluid guide pipe 4 onto the workpiece 1 is partly repelled by the workpiece 1 when the turntable 2 rotates. The repelled fluid is then repelled again by the inner wall surface of the spinner bowl 3, and the repelled fluid droplets are attached to and deposited on the open ends of the fluid guide pipes 4 through 6. The fluid deposits on the pipes 4 through 6 may fall onto the workpiece 1 before they are fully solidified on the pipes, so that the workpiece 1 may undesirably be contaminated. When this happens, the production of processed workpieces 1 suffers a low yield. Such workpiece contamination may be prevented by a device which wipes any fluid deposits off the open ends of the pipes 4 through 6 each time the fluid has been ejected from the fluid guide pipe 4, or a device which discharges a cleaning solution to wash away fluid deposits from the pipe ends. However, these additional devices make the production process complex, lower the efficiency of operation, and result in an increase in the cost of the fluid supplying and processing device.

SUMMARY OF THE INVENTION

In view of the aforesaid shortcomings of the conventional fluid supplying and processing device, it is an object of the present invention to provide a fluid supplying and processing device which can prevent a workpiece from being contaminated, but can be manufactured without a substantial increase in the cost thereof.

According to the present invention, a fluid supplying and processing device includes a support means for supporting a workpiece, and a plurality of fluid guide pipes for discharging fluids supplied from respective fluid sources through distal ends of the pipes which open above the carrier means, at least one of the fluid guide pipes having a distal end portion inserted in another of the fluid guide pipes. The outer side surface of the distal end portion of said one fluid guide pipe is cleaned by a fluid flowing through the other fluid guide pipe.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
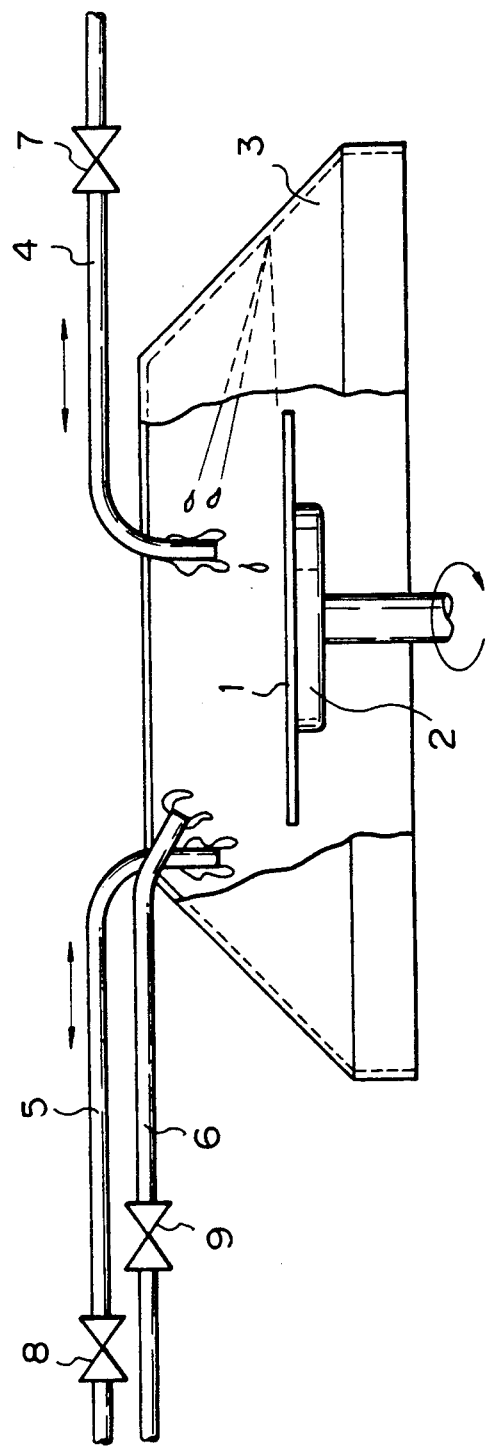
FIG. 1 is a front elevational view, partly broken away, of a conventional fluid supplying and processing device.

A fluid supplying and processing device according to the present invention, which is shown in FIG. 1, is used to produce an optical disc master as a stamper for injection-molding an optical information storage disc. More specifically, selected areas of a photosensitive resin layer coated on a glass disc are exposed to ultraviolet radiation, and the other areas which have not been exposed to ultraviolet radiation are dissolved away by fluids supplied by the fluid supplying and processing device, thus forming recording tracks on the disc.

Figure 2:
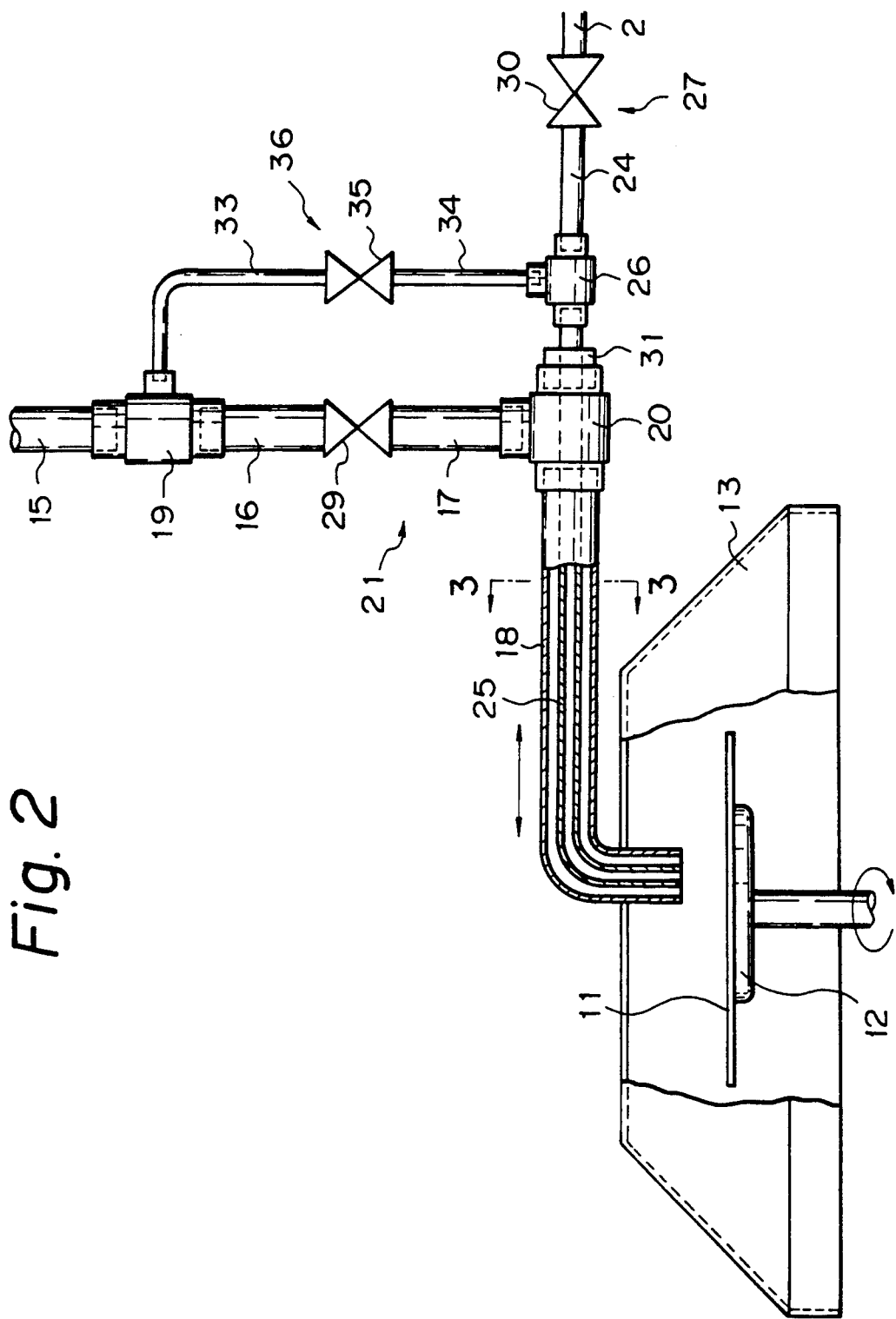
FIG. 2 is a front elevational view, partly broken away, of a fluid supplying and processing device according to the present invention.

As shown in FIG. 2, the fluid supplying and processing device has a turntable 12 as a support means for supporting a workpiece 11 such as a glass disc. The glass disc 11 is prepared by first coating a glass disc blank with a photosensitive resin layer, and then exposing the coated photosensitive resin layer to ultrasonic radiation to polymerize recording track areas to make these track areas less dissolvable (in case a positive photoresist is used). The turntable 12 is rotated by a rotative drive mechanism (not shown). The glass disc 11 is clamped in position on the turntable 12 by means of a vacuum chuck (not shown).

An umbrella-shaped spinner bowl 13 is disposed in enclosing relation to a working region around the turntable 13. Above the spinner bowl 13, there are disposed a first fluid guide conduit 21 comprising a plurality of pipe members 15, 16, 17, 18 which are interconnected by T-shaped pipes 19, 20 and a second fluid guide conduit 27 comprising a plurality of pipe members 23, 24, 25 interconnected by a T-shaped pipe 26. The second fluid guide pipe 27 serves to guide a developing organic solvent supplied from a fluid source (not shown). The pipe member 25 of the second fluid guide conduit 27 has a distal end opening into the spinner bowl 13 and above the glass disc 11 on the turntable 12. The developing organic solvent is discharged from the open end of the pipe member 25 toward the glass disc 11. The first fluid guide conduit 21 serves to guide deionized cleaning water supplied from a fluid source (not shown). The pipe member 18 of the first fluid guide conduit 21 has a distal end opening into the spinner bowl 13 and above the glass disc 11 on the turntable 12. The deionized cleaning water is discharged from the open end of the pipe member 18 toward the glass disc 11. The supply of the fluids through the first and second fluid guide conduits 21, 27 is controlled by automatically opening and closing cocks 29, 30 as guide pipe opening and closing means at timing intervals described later on.

Figure 3:
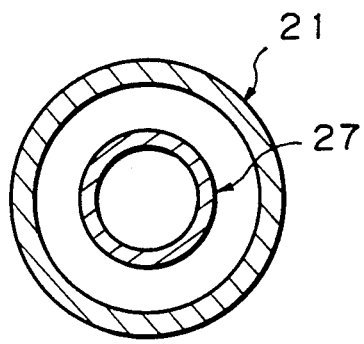
FIG. 3 is a cross-sectional view taken along line III—III of FIG. 2.

As also shown in FIG. 3, the inner diameter of the pipe member 18 of the first fluid guide conduit 21 is larger than the outer diameter of the pipe member 25 of the second fluid guide conduit 27. The distal end portion of the second fluid guide conduit 27, i.e., the pipe member 25, is inserted concentrically in the distal end portion of the first fluid guide conduit 21, i.e., the pipe member 18. More specifically, an intermediate member or socket 31 is threaded in one opening of the T-shaped pipe 20 of the first fluid guide conduit 21. The pipe member 25 of the second fluid guide conduit 27 is inserted through the socket 31 not the pipe member 18 of the first fluid guide conduit 21.

The T-shaped pipe 19 of the first fluid guide conduit 21 and the T-shaped pipe 26 of the second fluid guide conduit 27 are connected to each other by a communication pipe 36 which comprises two pipe members 33, 34 interconnected by an open-close valve, or cock 35. The T-shaped pipe 19 is positioned upstream of the cock 29 which open and closes the first fluid guide conduit 21, whereas the T-shaped pipe 26 of the second fluid guide conduit 27 is positioned downstream of the cock 30 which opens and closes the second fluid guide pipe 27.

The first fluid guide conduit 21, the second fluid guide conduit 27, and the communication pipe 36 are jointed to each other such that when the organic solvent is discharged from the second fluid guide conduit 27, these conduits 21, 27, 36 are moved radially with respect to the turntable 12. The fluids are discharged from the first and second fluid guide conduits 21, 27 i.e. those pipe members 18, 25 while the turntable 12 is being rotated.

Operation of the fluid supplying and processing device thus constructed will be described below.

The glass disc 11 carrying thereon a photocurable layer already exposed to a writing beam is placed on the turntable 12 and fixed with respect to the turntable 12 by a clamping means such as a vacuum chuck. Then, the turntable 12 is rotated at a predetermined speed. Thereafter, the first and second fluid guide pipe members 18, 25 are moved in the radial direction of the turntable 12 to position their open distal ends or fluid outlet ports near the center of rotation of the turntable 12. Then, the cock 30 is opened by a controller (not shown) to start discharging the developing organic solvent from the second fluid guide pipe 27. While the developing organic solvent is being discharged, the fluid outlet port of the second fluid guide pipe member 25 is gradually moved, together with the first fluid guide pipe member 18, radially outwardly until the fluid outlet port of the pipe member 25 is positioned over the outer circumferential edge of the glass disc 11 on the turntable 12. Now, the developing organic solvent is supplied to the entire surface of the glass disc 11, and dissolves away unnecessary areas of the photosensitive resin layer coated on the glass disc 11. The recording tracks which have been formed on the disc glass 11 by exposure to ultrasonic radiation are then produced as a resist pattern, whereupon the developing process is completed.

Immediately thereafter, the cock 30 is closed to discontinue the supply of the developing organic solvent based on a time elapse signal from a timer or a development completion signal from a development monitor device which utilized diffracted light for detection. At the same time, the cock 29 is opened by the controller to supply the deionized cleaning signal through the first fluid supply conduit 21 onto the glass disc 11, thereby removing residual organic solvent deposits from the surface of the glass disc 11. Simultaneously, the cock 35 is also opened to supply the deionized water through the communication pipe 36 into the pipe member 25 of the second fluid guide conduit 27.

The developing organic solvent supplied through the second fluid guide pipe member 25 is of a solidifiable nature, and a portion thereof tends to stick to the distal open end of the pipe 27. However, the organic solvent attached to the pipe member 25 is washed away by the deionized water discharged through the first fluid guide conduit 21 before the organic solvent starts to become solidified. Therefore, the organic solvent does not form a solidified deposit on and near the distal open end of the second fluid guide pipe member 25. Since no organic solvent deposit falls from the pipe member 25 onto the glass disc 11, the glass disc 11 is prevented from being contaminated by such organic solvent deposits.

After the second fluid guide pipe member 25 has stopped discharging the organic solvent, any residual organic solvent remaining in the second fluid guide member member 25 downstream of the cock 30 might be discharged and drop onto the glass disc 11. However, such residual organic solvent is forced out by the flush of deionized water that is supplied from the bypass or communication pipe 36 to the second fluid guide conduit 27. As a consequence, the glass disc 11 is free of the danger of getting contaminated by such residual organic solvent which would otherwise remain in the pipe 27.

Through the aforesaid process, the recording tracks are formed as the resist pattern on the surface of the glass disc 11. The glass disc 11 with the resist track pattern serves as an optical disc master or stamper for injection-molding an optical information storage disc. Subsequently, the optical disc master is washed by water supplied from a water supply (not shown), and then the turntable 12 is rotated to dewater the optical disc master under centrifugal forces. Now, one cycle of processing the glass disc 11 with the fluid supplying and processing device is completed. This cycle of operation is normally controlled automatically by a process controller or the like.

In the above embodiment, the fluid supplying and processing device or spinner is employed in the process of manufacturing optical disc masters. However, the spinner of the present invention may be incorporated in any of various other processes which require a fluid supplying and processing device.

The fluids employed in the fluid supplying and processing device are not limited to liquids as described above, but may be gases, liquids containing granular solids, gases containing granular solids, or any other fluids or combinations of fluids which can be delivered through pipes.

Figure 4:
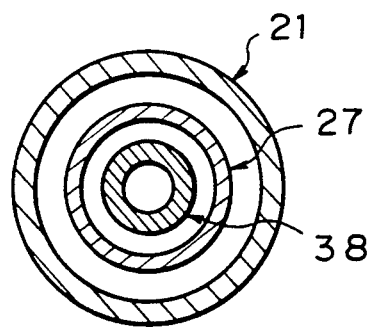
FIGS. 4 and 5 are cross-sectional views showing modifications of the fluid supplying and processing device shown in FIG. 2.
Figure 5:
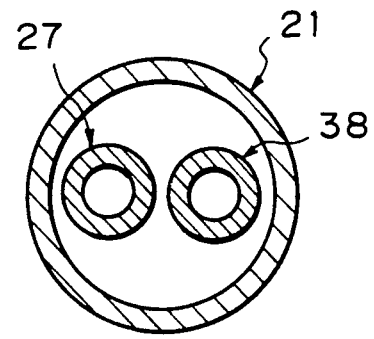

In the embodiment shown in FIGS. 2 and 3, only the second fluid guide pipe member 27 extends through the first fluid supply pipe member 18. However, as shown in FIG. 4, another third fluid guide pipe 38 may be concentrically inserted through the second fluid guide pipe member 25, thus providing a triple-walled pipe construction. Still another fluid guide pipe may be added to make a quadruple-walled pipe assembly. Alternatively, as illustrated in FIG. 5, fluid guide pipes 25, 38 may be placed side by side in a fluid guide pipe member 18. According to a further modification, concentric guide pipes and a juxtaposed guide pipe or pipes may be disposed in a fluid guide pipe.

With the present invention, the fluid supplying and processing device includes a support means for supporting a workpiece, and a plurality of fluid guide pipes for discharging fluids supplied from respective fluid sources through distal ends of the pipes which open above the carrier means, at least one fluid guide pipe having distal end portion inserted in another fluid guide pipe.

Therefore, the outer side surface of the distal end portion of said one fluid guide pipe can be cleaned by a fluid flowing through the other fluid guide pipe. Even if a fluid supplied through said one fluid guide pipe is of a solidifiable nature, any deposit of that fluid on the distal end portion of said one fluid guide pipe is removed by the cleaning fluid before it is solidified, and hence will not fall onto the workpiece. The workpiece is thus prevented from being contaminated by undesirable fluid deposits. Since the fluid guide pipes can be assembled into a double- or triple-walled construction relatively inexpensively, the cost of the fluid supplying and processing device can be manufactured without a substantial increase in the cost.

Although certain preferred embodiments have been shown and described, it should be understood that many changes and modifications may be made therein without departing from the scope of the appended claims.

What is claimed is:

1. A fluid supplying and processing device comprising:
   carrier means for carrying a workpiece;
   a housing surrounding said carrier means;
   a plurality of fluid supply sources;
   a plurality of fluid guide pipes each having a distal end open to a cavity within said housing at a place above said carrier means; and
   communication means for selectively communicating said fluid guide pipes with said fluid sources;
   at least one of said fluid guide pipes has the distal end portion thereof inserted in the distal end of another of said fluid guide pipes so that both distal ends of said one and another of said fluid guide pipes are open to said cavity separately from each other,
   one of said fluid supply sources supplying a cleaning fluid,
   said communication means including a first means for selectively communicating said one of said fluid supply sources with said one and another of fluid guide pipes.

2. A fluid supplying and processing device according to claim 1, wherein said distal end portion of said one fluid guide pipe in said other fluid guide pipe surrounds a smaller-diameter one of said fluid guide pipes.

3. A fluid supplying and processing device according to claim 1, wherein at least two of said fluid guide pipes have at least distal end portions inserted side by side in said other fluid guide pipe.

4. A fluid supplying and processing device according to claim 1, in which said communication means further includes a second means for selectively communicating another than said one of the fluid supply sources with said one of the fluid guide pipes, and a third means for communicating said one of the fluid supply sources with said one of the fluid guide pipes as long as said second means interrupt its communication.

5. A fluid supplying and processing device according to claim 1, in which said workpiece is a disc carrying thereon a photo-resist layer already processed with a light beam, and said another of the fluid supply sources supplies a developing organic solvent for dissolving a non-cured portion of said photocurable layer.

6. A fluid supplying and processing device according to claim 5, in which said cleaning fluid is a deionized cleaning water.

7. A fluid supplying and processing device comprising:
   carrier means for carrying a workpiece;
   a housing surrounding said carrier means;
   a plurality of fluid supply sources;
   a plurality of fluid guide pipes each having distal ends open to a cavity within said housing at a place above said carrier means; and
   communication means for selectively communicating said fluid guide pipes with said fluid sources;
   at least one of said fluid guide pipes has a distal end portion inserted in a distal end of another of said fluid guide pipes so that both distal ends of said one and another of said fluid guide pipes are open to said cavity separately from each other,
   one of said fluid supply sources supplying a cleaning fluid,
   said communication means including a first open-close valve means for selectively communicating said another of said fluid supply sources with said one of the fluid guide pipes, a second open-close valve means for selectively communicating a different one than said one of said fluid supply sources with said one of the fluid guide pipes, and a third open-close valve means for communicating said one of the fluid supply sources with said one of the fluid guide pipes when said second open-close valve means is closed.

* * * * *